(12) United States Patent
Yamada

(10) Patent No.: US 7,103,859 B2
(45) Date of Patent: Sep. 5, 2006

(54) SYSTEM AND METHOD FOR IMPROVING TESTABILITY INDEPENDENT OF ARCHITECTURE

(75) Inventor: Takamitsu Yamada, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 475 days.

(21) Appl. No.: 10/323,514

(22) Filed: Dec. 18, 2002

(65) Prior Publication Data

US 2003/0149915 A1 Aug. 7, 2003

(30) Foreign Application Priority Data

Dec. 26, 2001 (JP) ............................. 2001-393127

(51) Int. Cl.
*G06F 17/50* (2006.01)

(52) U.S. Cl. ..................... 716/4; 716/18; 702/181; 714/726

(58) Field of Classification Search ............... 702/181; 714/726; 365/201; 716/4, 18
See application file for complete search history.

(56) References Cited

U.S. PATENT DOCUMENTS

| | | | |
|---|---|---|---|
| 5,282,150 A | | 1/1994 | Yamada |
| 5,388,058 A | | 2/1995 | Yamada |
| 5,748,497 A | * | 5/1998 | Scott et al. ............... 702/181 |
| 6,059,451 A | * | 5/2000 | Scott et al. ............... 714/726 |
| 6,363,520 B1 | * | 3/2002 | Boubezari et al. ........... 716/18 |
| 2003/0053358 A1 | * | 3/2003 | Kundu et al. .............. 365/201 |

FOREIGN PATENT DOCUMENTS

| | | |
|---|---|---|
| JP | 5241882 | 9/1993 |
| JP | 6103101 | 4/1994 |
| JP | 8-15382 | 1/1996 |
| JP | 2711492 | 10/1997 |

OTHER PUBLICATIONS

Boubezari, S. et al., Testability Analysis and Test-Point Insertion in RTL VHDL Specifications for Scan-Based BIST, IEEE Trans. on Computer-Aided Design of Integrated Circuits and Systems, vol. 18, Issue 9, pp. 1377-1340, Sep. 1999.*
Claims, Abstract and Drawings of U.S. Appl. No. 10/118,254, filed Apr. 9, 2002.

* cited by examiner

*Primary Examiner*—A. M. Thompson
*Assistant Examiner*—Nelson Lam
(74) *Attorney, Agent, or Firm*—Cooper & Dunham LLP

(57) ABSTRACT

A testability analysis system analyzes testability by evaluating controllability and observability at the level of a hardware functional description independent of architecture. The testability analysis system comprises: an input part inputting functional description data to define a hardware function; a register variable identifying part identifying register variables whereby memory elements such as a flip-flop in said functional description data are inferred; a random pattern generator applying random patterns to the register variable identified by said register variable identifying part; a simulator conducting a simulation on an event caused by applying the random patterns; and an analysis part analyzing a cause of decrease of a fault coverage by LogicBIST, which is mainly caused by the difficulty of detecting faults by the random pattern test that PRPG (Pseudo Random Pattern Generator) of the Scan-Based LogicBIST executes, based upon toggle rates and simulation events of variables (such as net and bus) in said functional description data in accordance with a result of said simulation.

10 Claims, 7 Drawing Sheets

```
module sample ( clk, reset, din, ...);
input    clk;
input    reset;
input    din;
reg      data;

always @( posedge clk or negedge reset)
begin
   if ( !reset) data < = 0;
   else data <= din;
end
...
endmodule
```

FIG.5

```
1  module sample( clk, reset, DA, DB, DC, DD);
2  input clk;
3  input reset;
4  input [15:0] DA,DB,DC;
5  output DD;
6  reg [15:0] A,B,C,D;
7
8  wire SEL;
9
10 assign SEL = |C;
11
12 always @(posedge clk or negedge reset) begin
13   if ( !reset) begin
14     A <= 0;
15     B <= 0;
16     C <= 0;
17     D <= 0;
18   else
19     A <= DA;
20     B <= DB;
21     C <= DC;
22     D <= DD;
23   end
24 end
25 endmodule
```

FIG.6

```
module test;
integer i;
reg    reset;

task force_rand;
begin
    force sample.A = $random;
    force sample.B = $random;
    force sample.C = $random;
    force sample.D = $random;
end
endtask;

sample sample(.reset(reset));

initial begin
   while ( i < 64) begin
      #50;
      force_rand;
   end
end
endmodule
```

LBISTEN

SYSTEM AND METHOD FOR IMPROVING TESTABILITY INDEPENDENT OF ARCHITECTURE

BACKGROUND OF THE INVENTION

1. Field of the Invention

The present invention generally relates to testability analysis systems and methods, designs for testability system and method and, more particularly, to a testability analysis system and method, and a design for testability system and method that can analyze controllability and observability with a logic built-in self testing mechanism at the level of a hardware functional description independent of architecture for a large scale integrated circuit.

2. Description of the Related Art

As an integrated circuit becomes more large-scaled and performs more complicated operations, more time is required to design a test pattern for testing the integrated circuit. In some cases, the required test design time exceeds time to design the integrated circuit.

Accordingly, it is indispensable to prepare a DFT (Design For Testability) whereby a large-scale integrated circuit is provided with some measures for reducing some burdens on test design and test implementation at a logic design level.

Recently, the DFT technique has adopted BIST (Built-In Self Test). In the BIST, a circuit for automatically testing an integrated circuit is built in the integrated circuit. By using the BIST, it is possible to efficiently test the integrated circuit even while the integrated circuit is being manufactured and is being operated in the field.

The BIST has less constraints with respect to the length of a test sequence because the number of BIST scan chains can be increased over the number of extent chains. On the other hand, it is required to suppress an increase of the chip size as much as possible. There are some methods to fulfill the testing requirement, typically an exhaustive test and a random test. The above two methods can use simple hardware such as an LFSR (Linear Feedback Shift Register) to generate a test sequence. Especially, the LFSR for generating random patterns is called PRPG (Pseudo Random Pattern Generator). Regarding evaluation of test results, there are several methods. In one method, whenever one test result is obtained, the test result is compared with an expected value. However, the BIST adopts not this method but a different analysis method. In the BIST, after a collection of test results are compressed by using a multi-input LFSR, the compressed test results are compared with a reference value (Signature Analysis). (ref. Japanese Laid-Open Patent Application No. 05-241882, and Japanese Patent No. 2711492) However, the signature analysis has a problem in that when an X (an unstable signal condition) is propagated to the multi-input LFSR, the reference value, which is called the signature, is collapsed.

Regarding test design using LogicBIST (Logic Built-In Self Test) in an integrated circuit, a conventional design flow is as follows. First, a netlist dependent upon a technology is generated by a logic synthesis from a hardware functional description independent of architecture. Then after a scan path test mechanism and a LogicBIST controller are added to the netlist, a fault simulator examines fault analysis and evaluates the fault coverage (fault detection rate). If the fault coverage is not sufficient, the controllability and the observability are evaluated based upon a report offered by the fault simulator and the netlist. Based upon the evaluation result, an appropriate testing circuit may be added or the hardware functional description may be modified in some cases. Here, the fault coverage in the LogicBIST decreases mainly because of the difficulty of detecting faults by the random pattern test that the PRPG in the Scan-Based LogicBIST executes.

According to such a conventional LogicBIST insertion flow, there arise some problems with respect to the controllability and the observability. First, the controllability and the observability cannot be evaluated without the fault simulator. Since a CAD tool is provided for each of a logic synthesis, a scan path insertion, a LogicBIST insertion and a fault simulator execution, it is necessary to consider total time to run the individual CAD tools. Second, it is difficult to analyze the controllability and the observability because the controllability and the observability analysis must be examined from the netlist being at the gate level dependent upon the technology. Third, it is difficult to incorporate the analysis result into the hardware functional description independent of the architecture. Fourth, if the testing circuit is inserted in the netlist after analyzing the controllability and the observability, the hardware performance becomes degraded.

On the other hand, Japanese Laid-Open Patent Applications No. 06-103101 and No. 08-15382 disclose a Logic BIST using LFSR.

In a technique according to Japanese Laid-Open Patent Application No. 06-103101, the testability is analyzed for a netlist being at the gate level so as to improve the fault coverage.

However, in the technique, the testability is not analyzed at the level of a hardware functional description independent of architecture.

A technique according to Japanese Laid-Open Patent Application No. 08-15382 is related to measures for the X (an unstable signal condition) propagation problem on the LogicBIST method and measures for a netlist being at the gate level by the simulation forcing the random patterns. However, the technique cannot be used to check the X propagation at a level of a hardware functional description independent of architecture.

SUMMARY OF THE INVENTION

It is a general object of the present invention to provide a testability analysis system and method and a system and method of design for testability in which the above-mentioned problems are eliminated.

A more specific object of the present invention is to provide a testability analysis system and method that can analyze testability by evaluating the controllability and observability analysis at the level of hardware functional description independent of architecture and a system and method of design for testability that can examine design constraints on an X (unstable signal condition) propagation problem on Logic BIST technology at the level of the hardware functional description independent of architecture.

In order to achieve the above-mentioned objects, there is provided according to one aspect of the present invention a testability analysis system, comprising: an input part inputting functional description data to define hardware function; a register variable identifying part identifying register variables whereby memory elements such as flip-flops as logic syntheses in the functional description data are inferred; a random pattern generator applying random patterns to the register variables identified by the register variable identifying part; a simulator conducting a simulation of events caused by applying the random patterns; and an analysis part analyzing a cause of decrease of a fault coverage by Scan- Based Logic BIST based upon toggle rates and simulation events of variables (such as net and bus) in the functional description data in accordance with a result of the simulation.

Additionally, there is provided according to another aspect of the present invention a testability analysis method, comprising the steps of: inputting functional description data to define a hardware function; identifying register variables whereby memory elements in the functional description data are inferred; conducting a simulation by applying random patterns to the register variables identified; and analyzing a cause of decrease of a fault coverage by Scan-Based Logic BIST based upon toggle rates and simulation events of variables (such as net and bus) in the functional description data in accordance with a result of the simulation.

According to the above-mentioned inventions, since a simulation status can be evaluated at a level of a hardware functional description independent of architecture by the random patterns that would be applied and forced from the PRPG to the synthesized netlist, it is possible to analyze the controllability and the observability based upon the toggle rates and the simulation events. Thus, before the execution of a logic synthesis, a scan insertion, a LogicBTST controller insertion and a fault simulation necessary for a conventional analysis for the controllability and the observability, it is possible to improve the testability. Furthermore, the use of the hardware functional description independent of architecture makes it possible to simplify an operation and improve design efficiency.

Further, there is provided according to another aspect of the present invention a design for testability system, comprising: an input part inputting functional description data to define a hardware function; a register variable identifying part identifying register variables whereby memory elements such as Flip-Flops at synthesized netlists in the functional description data are inferred; a constraint setting part setting constraints for Scan-Based Logic BIST; a random pattern generator applying random patterns to the register variables identified by the register variable identifying part based upon the constraints; a simulator conducting a simulation of events caused by applying the random patterns; and an evaluation part evaluating whether or not an X is propagated in the functional description data and captured into the register variables identified by the register variable identifying part from a result of the simulation.

Additionally, there is provided according to another aspect of the present invention a design for testability method, comprising the steps of: inputting functional description data to define a hardware function; identifying register variables whereby memory elements in the functional description data are inferred; conducting a simulation by applying random patterns to the register variables identified under constraints for Scan-Based Logic BIST; and evaluating whether or not an X is propagated in the functional description data and captured into the register variables from a result of the simulation.

According to the above-mentioned inventions, since a rule pertaining to an X (unstable signal) propagation can be checked at a level of the hardware functional description independent of architecture, it is unnecessary to feedback an analysis by a netlist being at a gate level dependent upon a technology, as in a conventional method. Thus, it is possible to improve design efficiency.

Further, there is provided according to another aspect of the present invention a design for testability method, comprising the steps of: inputting functional description data to define a hardware function; identifying register variables whereby memory elements in the functional description data are inferred; conducting a simulation by applying random patterns to the register variables identified; analyzing a cause of decrease of a fault coverage by Scan-Based Logic BIST based upon toggle rates and simulation events (such as net and bus variables) in the functional description data in accordance with a result of the simulation; and setting an alternate path of data for any signal in the functional description data by using a test mode signal as a selector for a net whose fault coverage is not sufficient based upon the analysis result.

According to the above-mentioned invention, when a logic synthesis is conducted, the testability can be evaluated for the test by means of the LogicBIST and an alternate path and a testing circuit can be added for a net whose toggle rates and simulation events are not sufficient. As a result, it is possible to avoid a circuit timing degradation caused by the addition of a testing circuit to a netlist being at the gate level, as compared to a conventional method.

Other objects, features and advantages of the present invention will become more apparent from the following detailed description when read in conjunction with the accompanying drawings.

BRIEF DESCRIPTION OF THE DRAWINGS

FIG. 5 shows an example of functional description data to explain a testbench in which random patterns are applied;

FIG. 6 shows the testbench in which the random patterns are applied to the functional description data;

DETAILED DESCRIPTION OF THE PREFERRED EMBODIMENTS

In the following, embodiments of the present invention will be described with reference to the accompanying drawings.

Figure 1:
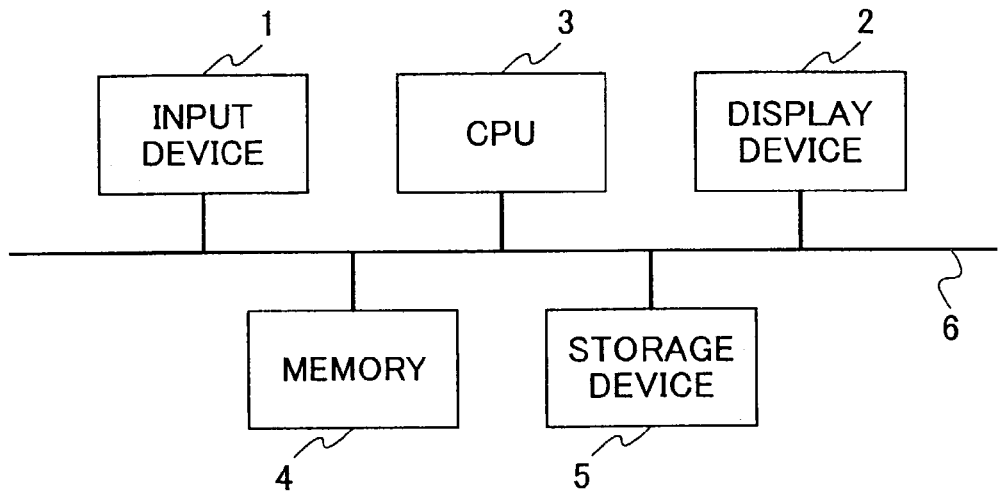
FIG. 1 is a diagram illustrating a hardware configuration to implement the present invention.

FIG. 1 is a diagram illustrating a computer configuration to implement a testability analysis system and a design for testability system according to embodiments of the present invention. In FIG. 1, a computer comprises an input device 1, a display device 2, a CPU (Central Processing Unit) 3, a memory 4, and a storage device 5 that are connected to each other via a system bus 6.

The input device 1 is provided with a keyboard, a mouse, a touch panel or similar input means, and serves interactively for some input operations, such as an operation to input and edit a hardware functional description and an operation to instruct an execution of the hardware functional description.

The display device 2 is provided with a CRT (Cathode Ray Tube) display device, a liquid crystal display device or similar display means, and serves to display the hardware functional description, input information through the input device 1, and status and result of execution of programs.

The CPU 3 serves to execute various programs.

The memory 4 temporarily maintains the programs together with information used by the CPU 3 during execution.

The storage device 5 maintains a hardware functional description independent of architecture, data, a program to implement embodiments of the present invention, temporary information pertaining to a program execution, and so on.

Figure 2:
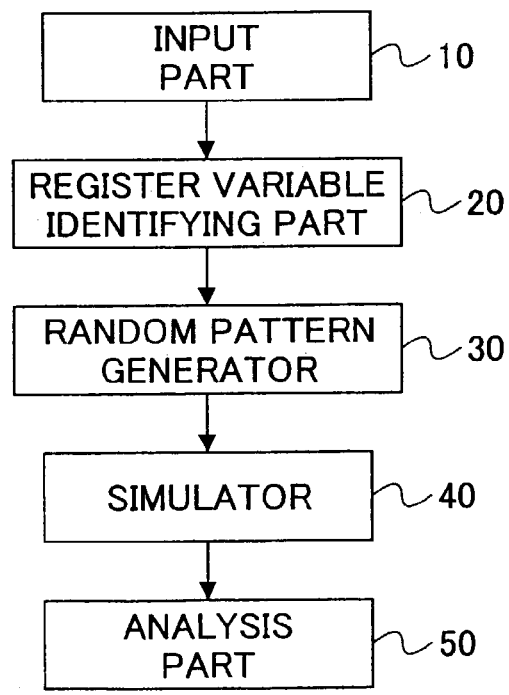
FIG. 2 is a block diagram illustrating a functional structure according to a first embodiment of the present invention.

FIG. 2 is a block diagram illustrating a functional structure of a testability analysis system according to the first embodiment of the present invention.

In FIG. 2, a function of the first embodiment comprises an input part 10, a register variable identifying part 20, a random pattern generator 30, a simulator 40, and an analysis part 50.

The input part 10 reads a hardware functional description independent of architecture from the input device 1 and temporarily saves the read hardware functional description in the storage device 5 for a later process. Here, the hardware functional description independent of architecture is written in an IEEE standard description language such as VHDL (Very high speed IC Hardware Description Language), HDL (Hardware Description Language), and Verilog-HDL. It is noted that the input part 10 may be provided to extract a hardware functional description saved in the storage device 5 in advance.

The register variable identifying part 20 identifies register variables whereby memory elements such as flip-flops can be inferred in the hardware functional description read by the input part 10. The memory elements constitute scan flip-flops after a scan insertion to the logic-synthesized netlist. Also, random patterns generated by the PRPG are applied and forced via a scan path at the LogicBIST.

In the description languages VHDL and Verilog-HDLA, a logic synthesis system prescribes a description form to infer the memory elements. As is shown in FIG. 3, in the Verilog-HDL, a sensitivity is described by the "posedge" description of a clock to synchronize with a variable in the "always" sentence wherein the variable is declared as a reg variable.

The register variable recognition part 20 detects the above-mentioned description from the read hardware functional description and identifies a flip-flop circuit to be inferred by logic-synthesizing the variable in the left side of the assignment statement. The register variable is logic-synthesized by the logic synthesis system and is substituted for a scan cell by a scan path insertion of a full scan. Also, the register variable becomes a control point of test data by a pseudo random pattern.

Figures 3, 4:
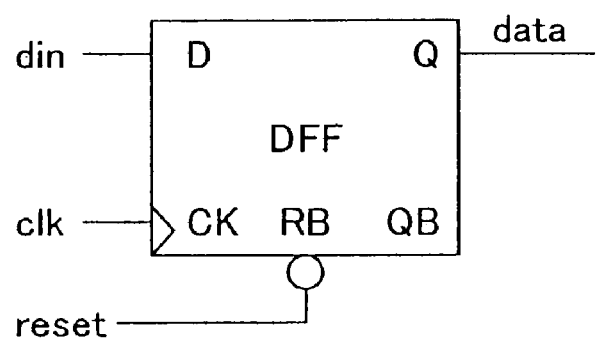
FIG. 3 shows an example of a hardware functional description by using VHDL.
FIG. 4 is a circuit diagram illustrating a flip-flop based upon the hardware functional description in FIG. 3.

FIG. 4 is a circuit diagram illustrating a circuit structure of the flip-flop circuit inferred from the hardware functional description in FIG. 3.

The random number generator 30 generates pseudo random patterns. When the generated random patterns are provided to the register variable identified by the register variable identifying part 20, a simulation is conducted.

The random pattern generator 30 may be formed by a testbench fed to the simulator 40. In a case in which the random pattern generator 30 is formed by the testbench, it is possible under a Verilog simulator to directly apply and force random patterns to register variables identified by the register variable recognition part 20 by a "force" statement and a system task of "$random".

It is noted that the "force" statement of the Verilog simulator can be directly applied even if the applied data are not an external port.

FIG. 6 shows the testbench in which the random patterns are applied and forced to the hardware functional description data shown in FIG. 5.

The simulator 40 is a functional simulator to conduct a simulation of a hardware functional description saved in the storage device 5, and a commercial simulator may be use as the simulator 40.

By using the simulator 40, it is possible to examine a test input status in LogicBIST by applying and forcing random patterns generated by the random pattern generator 30 to the register variables identified by the register variable identifying part 20. The simulation is operated as many times as possible to achieve a sufficient toggle rate from a bit length of a bus variable in the hardware functional description.

After the simulation, the analysis part 50 analyzes controllability and observability by aggregating simulation events and toggle rates of an internal variable (such as net and bus) in the hardware functional description, from coverage data. Then, the analysis result is shown on the display device 2.

When the simulation is conducted by using a commercial simulator, the simulation result outputs the event generating status as a dump file. Thus, it is possible to easily compute the simulation events and the toggle rates of the internal variable.

Regarding the analysis of the controllability and the observability, an internal variable whose simulation events and toggle rates are not sufficient is focused on so as to find a portion causing an insufficient fault coverage in LogicBIST.

For example, in an architecture having an AND logic operation for a 16-bit register value, only if the 16-bit register has "1"s for all the 16 bits, does the output become "1". However, since the input test data are formed of a sequence of pseudo random patterns in LogicBIST, the probability is very low that the 16-bit register has all "1"s in the 16 bits, which is also similar to a netlist at gate level being dependent upon a technology after the logic synthesis. That prevents the improvement of the fault coverage in LogicBIST.

If an output of the AND operation is a selector signal of the data bus, the fault coverage for the entire hardware system decreases. In this case, when the hardware functional description is referred to, it is easily determined whether or not the output is the selector signal of the data bus. As a result, it can be determined what portion leads to the decrease of the fault coverage, and if the simulation events and the toggle rates are annotated back to a CAD tool such as a viewer for the hardware functional description, the debugging becomes easy.

In the above description, while the random pattern generator 30 is executed via the testbench and the simulation events and the toggle rates are executed via the dump file, an access function of a PLI (Programming Language Interface) for the Verilog simulator may be used to perform processes from the register variable identification to the analysis result output of the simulation events and the toggle rates without such any intermediate file.

Figure 7:
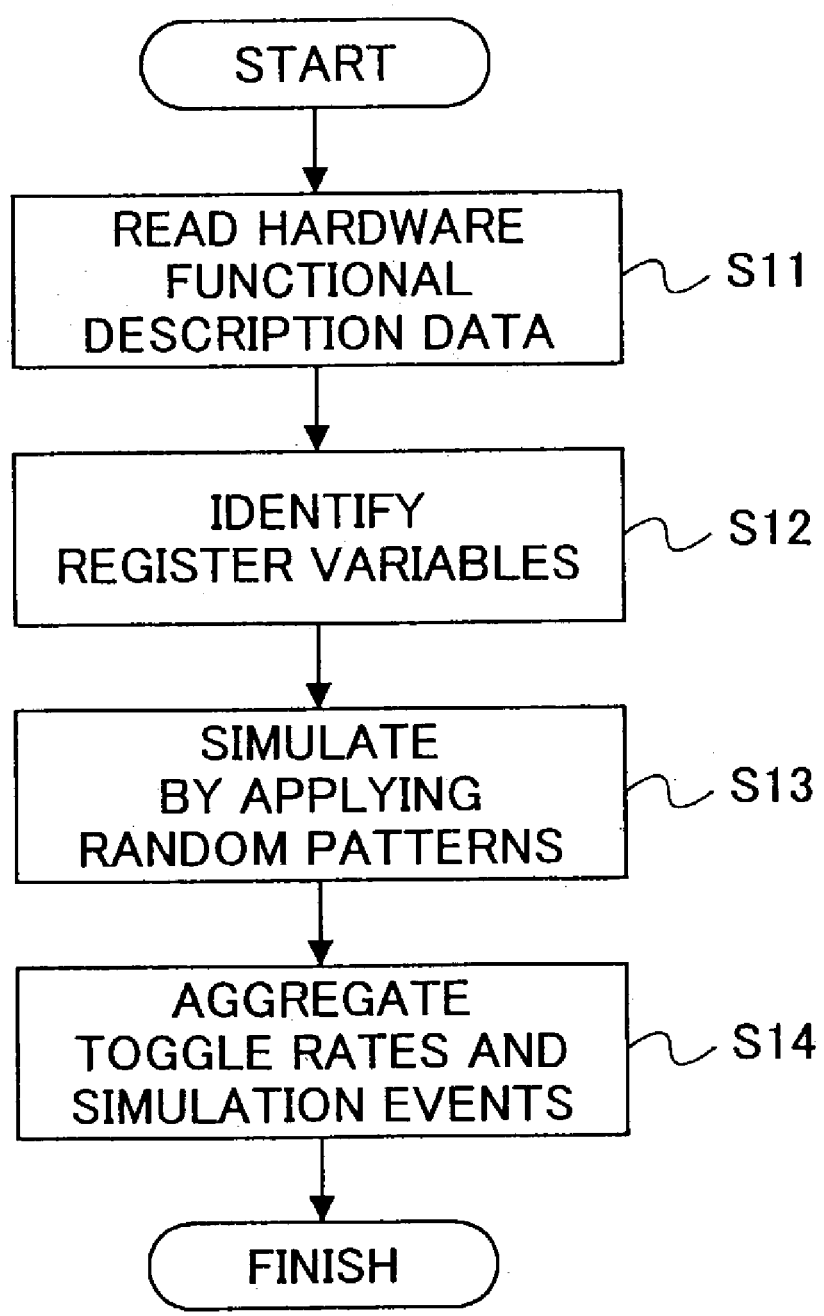
FIG. 7 is a flowchart illustrating a procedure of the first embodiment.

FIG. 7 is a flowchart illustrating a procedure of the first embodiment.

At step S11, a hardware functional description independent of architecture is read from the input device 1, and is temporarily saved in the storage device 5.

At step S12, register variables whereby memory elements can be inferred are identified and retrieved from the hardware functional description.

At step S13, random patterns are applied and forced the retrieved register variables, and a simulation is conducted. The simulation is conducted a plurality of times, and a designer determines the number of times based upon the bit length of the bus variable in the hardware functional description.

At step S14, by aggregating events generated by the simulation, the simulation events and the toggle rates are computed. Based upon the simulation events and the toggle rates, the controllability and observability are analyzed and the result is displayed on the display device 2.

A testability analysis system and a design for testability system according to the second embodiment of the present invention are provided to give constraints for a LogicBIST execution before random patterns are applied and forced. For example, when a test is conducted by a scan path, it is necessary to turn off an asynchronous reset signal so that the scan operation cannot be collapsed.

If such constraints can be appropriately set before the random patterns are applied and forced, it is possible to realize a simulation for a hardware functional description independent of architecture wherein the random patterns are applied and forced in a similar state in which LogicBIST is operated in a netlist being at the gate level.

It is noted that the LogicBIST is used together with a boundary scan testing mechanism proposed by an organization JTAG (Joint Test Action Group) whose members are semiconductor manufacturers in Europe and the U.S. In this case, it is sufficient to provide a sequence to be set to a "runbist" instruction of the JTAG before the random patterns are generated.

Figure 8:
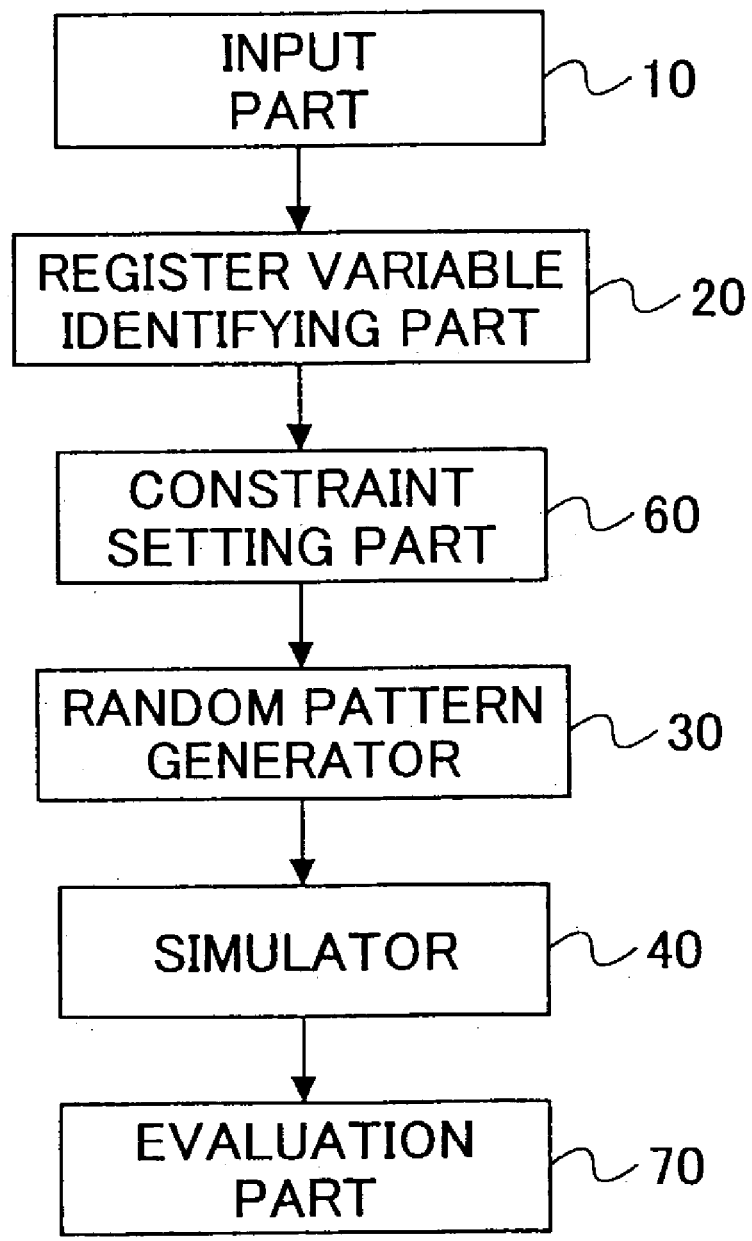
FIG. 8 is a block diagram illustrating a functional structure of a second embodiment of the present invention.

FIG. 8 is a block diagram illustrating a functional structure of a design for testability system according to the second embodiment of the present invention.

In FIG. 8, the design for testability system according to the second embodiment comprises an input part 10, a register variable identifying part 20, a random pattern generator 30, a simulator 40, a constraint setting part 60, and an evaluation part 70. In FIG. 8, those parts having the same function as the first embodiment are designated by the same reference numerals and the description thereof will be omitted.

The constraint setting part 60 sets constraints imposed before random patterns are applied and forced.

For example, if the constraint setting part 60 imposes the constraints such that an X (unstable signal) is applied to an external input signal and register variables identified by the register variable identifying part 20, the X is not applied to a VCC node and a GND fixed node, respectively, which are called a Tie fault and a Block fault, in a simulation of the simulator 40. As a result, there does not arise any event and the number of event generations becomes zero.

The evaluation part 70 displays the X propagation on the display device 2 if some events generations of the X are found in a result of the simulation. Thus, it is possible to evaluate the Tie fault and the Block fault at the level of the hardware functional description.

Figure 9:
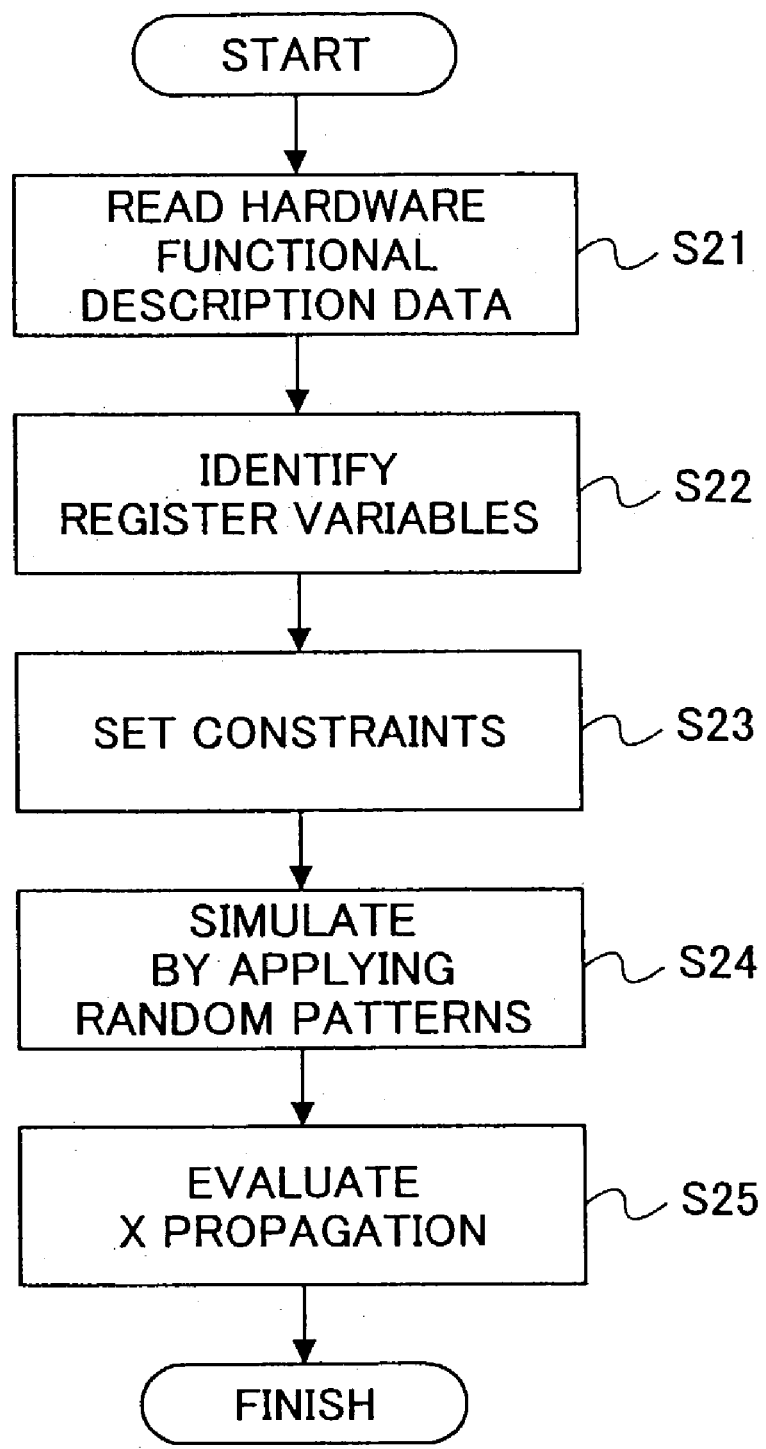
FIG. 9 is a flowchart illustrating a procedure of the second embodiment.

FIG. 9 is a flowchart illustrating a procedure of the second embodiment.

At step S21, a hardware functional description independent of architecture is read from the input device 1 and is temporarily saved in the storage device 5.

At step S22, register variables whereby memory elements can be estimated are identified and extracted from the hardware-functional description.

At step S23, constraints are set before random patterns are applied and forced, for example, the constraint such that an X (unstable signal) is applied to an external input signal and an identified register signal.

At step S24, the random patterns are applied and forced to the extracted register variables, and a simulation is conducted. The simulation is conducted a plurality of times, and a designer determines the number of times based upon the bit length of the bus variable in the hardware functional description.

At step S25, if an X event is found in the simulation result, the X propagation problem is displayed on the display device 2.

A conventional logic synthesis system has the function of extending an input hardware functional description to a memory and adding or removing any net, any port and any cell.

According to the third embodiment of the present invention, when this function is used to operate the LogicBIST, a test mode signal resulting in ON is added. Based upon an analysis result regarding testability in the first embodiment, an alternate path whose test mode is set as a selector is added to hardware functional description data extended in a memory of the logic synthesis system for a net whose toggle rates and simulation events are not sufficient.

Figure 10:
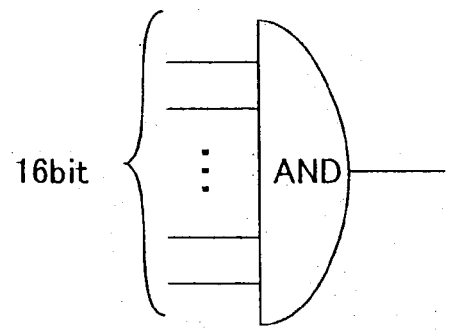
FIG. 10 shows an example of a circuit to be tested according to a third embodiment of the present invention.
Figure 11:
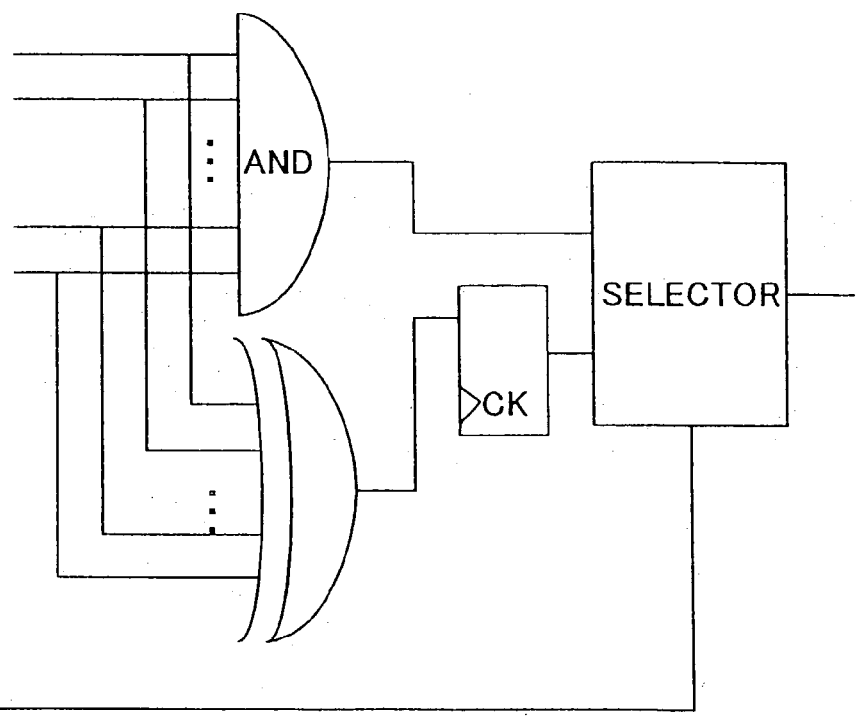
FIG. 11 shows a diagram wherein a test mode signal and an alternate path are added to the circuit to be tested in FIG. 10 and then the resulting circuit is extended on a memory of a logic synthesis system.

FIG. 11 shows a diagram wherein a test mode signal and an alternate path are added to a circuit to be tested shown in FIG. 10 and then the resulting circuit is extended on a memory of the logic synthesis system.

In this case, an LBISTEN signal is added to the test mode signal. Furthermore, an XOR function is added in consideration of observability with respect to a 16-bit input so as to select either a conventional function or an additional function by means of the test mode signal LBISTEN.

As a result, in the third embodiment, it is possible to examine the testability regarding a LogicBIST testing mode when the logic synthesis is operated and to add an alternate path and a testing circuit to a net whose toggle rates and simulation events are not sufficient. Thus, it is possible to avoid a circuit timing loss caused by an addition of a testing circuit to a netlist being at the gate level as in a conventional method.

The present invention is not limited to the above-mentioned embodiments. Programs to execute individual features of the above-mentioned embodiments may be written into a recording medium such as a CD-ROM so that a CPU in a computer can read and execute the saved programs in the recording medium by saving the programs into a memory or a storage device by means of an equipped medium driving device such as a CD-ROM drive. Also in the above method, the present invention is achieved.

Also, if the above-programs are saved in a ROM (Read Only Memory), it is unnecessary to provide such a medium driving device.

In this case, the programs read from the recording medium execute the function according to the embodiments of the present invention. Thus, the programs and the recording media in which the programs are saved constitute the present invention.

It is noted that the recording medium may be a semiconductor medium (for example, a ROM, a nonvolatile memory and so on), and a magnetic medium (for example, a magnetic tape, a flexible disk and so on).

When a loaded program is executed, it is possible to implement the above features according to the embodiments. Additionally, an operating system may perform a portion of the process or the whole process based upon instructions of the programs to implement the above features according to the embodiments.

Also, when the above programs are saved in a storage device in a server computer such as a magnetic disk and are distributed through downloads from user's computer in connection with the server computer via the Internet, the storage device of the server computer is included in the storage device of the present invention.

The present invention is not limited to the specifically disclosed embodiments, and variations and modifications may be made without departing from the scope of the present invention.

The present invention application is based upon Japanese priority application No. 2001-393127 filed Dec. 26, 2001, the entire contents of which are hereby incorporated by reference.

What is claimed is:

1. A testability analysis system, comprising:
   an input part inputting functional description data to define hardware function;
   a register variable identifying part identifying register variables whereby memory elements in said functional description data are inferred;
   a random pattern generator applying random patterns to the register variables identified by said register variable identifying part;
   a simulator conducting a simulation of events caused by applying the random patterns; and
   an analysis part analyzing a cause of decrease of a fault coverage by Scan-Based Logic BIST based upon toggle rates and simulation events of variables in said functional description data in accordance with a result of said simulation.

2. The system of claim 1, wherein testability is analyzed by evaluating controllability and observability at the level of hardware functional description independent of architecture.

3. The system of claim 1, wherein a simulation status caused by applying the random patterns from the random pattern generator is evaluated at the level of hardware functional description independent of architecture.

4. The system of claim 1, wherein the register variables identified by said register variable identifying part are inserted in a scan path of a full scan.

5. A testability analysis method, comprising the steps of:
   inputting functional description data to define a hardware function;
   identifying register variables whereby memory elements in said functional description data are inferred;
   conducting a simulation by applying random patterns to said register variables identified; and
   analyzing a cause of decrease of a fault coverage by Scan-Based Logic BIST based upon toggle rates and simulation events of variables in said functional description data in accordance with a result of said simulation.

6. A computer system comprising:
   a processor; and
   a program storage device readable by the computer system and tangibly embodying a program of instructions executable by the processor to perform the method claimed in claim 5.

7. A program storage device readable by a computer and tangibly embodying a program of instructions executable by the computer to perform the method claimed in claim 5.

8. A design for testability method, comprising the steps of:
   inputting functional description data to define a hardware function;
   identifying register variables whereby memory elements in said functional description data are inferred;
   conducting a simulation by applying random patterns to said register variables identified;
   analyzing a cause of decrease of a fault coverage by Scan-Based Logic BIST based upon toggle rates and simulation events in said functional description data in accordance with a result of said simulation; and
   setting an alternate path of data for any signal in said functional description data by using a test mode signal as a selector for a net whose fault coverage is not sufficient based upon the analysis result.

9. A computer system comprising:
   a processor; and
   a program storage device readable by the computer system and tangibly embodying a program of instructions executable by the processor to perform the method claimed in claim 8.

10. A program storage device readable by a computer and tangibly embodying a program of instructions executable by the computer to perform the method claimed in claim 8.

* * * * *